(12) United States Patent
Mori et al.

(10) Patent No.: US 11,901,234 B2
(45) Date of Patent: Feb. 13, 2024

(54) METHOD OF PROCESSING WAFER, AND CHIP MEASURING APPARATUS

(71) Applicant: DISCO CORPORATION, Tokyo (JP)

(72) Inventors: Takashi Mori, Tokyo (JP); Makoto Kobayashi, Tokyo (JP); Kazunari Tamura, Tokyo (JP); Okito Umehara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 18/184,181

(22) Filed: Mar. 15, 2023

(65) Prior Publication Data
US 2023/0223303 A1 Jul. 13, 2023

Related U.S. Application Data

(62) Division of application No. 17/024,210, filed on Sep. 17, 2020, now Pat. No. 11,637,039.

(30) Foreign Application Priority Data

Sep. 19, 2019 (JP) .................................. 2019-170181

(51) Int. Cl.
| | | |
|---|---|---|
| *H01L 21/67* | (2006.01) | |
| *H01L 21/78* | (2006.01) | |
| *H01L 21/66* | (2006.01) | |

(52) U.S. Cl.
CPC ........ *H01L 21/78* (2013.01); *H01L 21/67271* (2013.01); *H01L 22/12* (2013.01)

(58) Field of Classification Search
CPC ... H01L 21/78; H01L 21/67271; H01L 22/12; H01L 22/20; H01L 21/67288;
(Continued)

(56) References Cited

U.S. PATENT DOCUMENTS 6,352,073 B1 3/2002 Kurosawa et al.
8,906,745 B1 12/2014 Lindsey, Jr. et al.
(Continued)

FOREIGN PATENT DOCUMENTS

CN 1610085 A 4/2005
CN 202693428 U 1/2013
(Continued)

OTHER PUBLICATIONS

Office Action issued in counterpart German patent application No. 10 2020 211 723.3, dated Feb. 10, 2023.

*Primary Examiner* — Jarrett J Stark
(74) *Attorney, Agent, or Firm* — Greer Burns & Crain Ltd.

(57) ABSTRACT

There is provided a method of processing a wafer having devices formed in respective areas on a face side thereof that are demarcated by a plurality of crossing projected dicing lines on the face side. The method of processing a wafer includes a wafer unit forming step of forming a wafer unit having a wafer, a tape, and an annular frame, a dividing step of dividing the wafer along the projected dicing lines into a plurality of device chips, a pick-up step of picking up one at a time of the device chips from the wafer unit, and a measuring step of measuring the device chip picked up in the pick-up step. The method also includes a distinguishing step, before the pick-up step, of inspecting properties of the devices to distinguish acceptable devices and defective devices among the devices and storing distinguished results.

1 Claim, 14 Drawing Sheets

(58) Field of Classification Search
CPC .................. G01N 21/00; G01N 21/01; G01N 2021/0106–0187; G01N 3/00; G01N 3/08–12; G01N 3/20
See application file for complete search history.

(56) References Cited

U.S. PATENT DOCUMENTS

| | | |
|---|---|---|
| 2002/0019066 A1 | 2/2002 | Iketani |
| 2002/0187602 A1 | 12/2002 | Miura et al. |
| 2008/0057679 A1 | 3/2008 | Nakadate et al. |
| 2009/0191690 A1 | 7/2009 | Boyle et al. |
| 2010/0311226 A1 | 12/2010 | Hamasaki et al. |
| 2011/0097828 A1 | 4/2011 | Konno |
| 2013/0025791 A1 | 1/2013 | Marte et al. |
| 2014/0004696 A1 | 1/2014 | Kitabayashi |
| 2015/0039954 A1 | 2/2015 | Kekare |
| 2015/0188507 A1 | 7/2015 | Shimizu |
| 2015/0235969 A1 | 8/2015 | Zhang et al. |
| 2017/0082799 A1 | 3/2017 | Novack et al. |
| 2017/0151690 A1 | 6/2017 | Li |
| 2019/0019728 A1 | 1/2019 | Fitzgerald |
| 2019/0057936 A1 | 2/2019 | Gupta et al. |
| 2020/0182759 A1 | 6/2020 | Saito |

FOREIGN PATENT DOCUMENTS

| | | |
|---|---|---|
| JP | 2004512690 A | 4/2004 |
| JP | 2009094326 A | 4/2009 |
| JP | 2010087842 A | 4/2010 |
| JP | 2012084780 A | 4/2012 |
| JP | 2014516478 A | 7/2014 |
| JP | 2018064021 A | 4/2018 |
| WO | 2014046052 A1 | 3/2014 |

METHOD OF PROCESSING WAFER, AND CHIP MEASURING APPARATUS

This is a divisional application of application Ser. No. 17/024,210 filed Sep. 17, 2020, which claims the benefit of Japanese Patent Application No. 2019-170181, filed on Sep. 19, 2019.

BACKGROUND OF THE INVENTION

Field of the Invention

The present invention relates to a method of processing a semiconductor wafer.

Description of the Related Art

Heretofore, it has been known in the art that the finished state of the reverse side of a semiconductor wafer, dicing conditions, and the like under which the semiconductor wafer is diced affect the flexural strength of individual chips fabricated from the semiconductor wafer. For selecting processing conditions for each of wafer types, the flexural strength of chips, chippings of the chips, etc. are measured in advance. Optimum processing conditions for wafers are selected on the basis of the measured values. JP 2009-94326 A discloses a processing method for preventing the flexural strength of chips from being lowered in view of the fact that the processing of the wafer affects the flexural strength of the chips.

The flexural strength of a chip is measured by a three-point bending test. Since the three-point bending test is a test where an indenter is pressed against a chip to destroy the chip, it has been customary to measure the flexural strength using a dummy wafer, rather than a product wafer, and to select processing conditions for a product wafer by referring to the measured result in the past.

SUMMARY OF THE INVENTION

At present, the importance of the traceability of chips (device chips) that mainly include semiconductor devices for use on vehicles have been emphasized. Specifically, an identification (ID) is assigned to each of device chips, and in the event of a failure of a device chip incorporated in a product, the details of a processing sequence performed on the device chip and the properties of the device chip should be able to be referred to on the basis of the ID.

For realizing such traceability, it is necessary to record the properties of the device chip itself as the product, i.e., the properties of the wafer from which the device chip has been fabricated, but not the properties, such as flexural strength, etc. of the dummy wafer.

It is therefore an object of the present invention to provide a technology for obtaining the properties, such as flexural strength, etc. of a device chip as a product.

In accordance with an aspect of the present invention, there is provided a method of processing a wafer having devices formed in respective areas on a face side thereof that are demarcated by a plurality of crossing projected dicing lines on the face side, including a wafer unit forming step of forming a wafer unit having a wafer, a tape, and an annular frame, the tape being affixed to a reverse side of the wafer and having an outer circumferential portion affixed to the annular frame, a dividing step, before or after the wafer unit forming step, of dividing the wafer along the projected dicing lines into a plurality of device chips, a pick-up step of picking up one at a time of the device chips from the wafer unit after the wafer unit forming step and the dividing step, a measuring step of measuring the device chip picked up in the pick-up step, and a distinguishing step, before the pick-up step, of inspecting properties of the devices to distinguish acceptable devices and defective devices among the devices and storing distinguished results, in which the measuring step includes the step of measuring the flexural strength of the device chip picked up in the pick-up step by fracturing the device chip if the device chip includes a defective device on the basis of the distinguished result, and the step of measuring one or more of chipping, reverse side roughness, and side surface roughness of the device chip picked up in the pick-up step if the device chip includes an acceptable device.

The method of processing a wafer may further include a storing step, after the measuring step, of storing the device chip picked up in the pick-up step into a chip storage tool if the device chip includes an acceptable device.

In accordance with another aspect of the present invention, there is provided a chip measuring apparatus including a controller for referring to attribute information representing whether a device chip to be inspected is an acceptable device or a defective device, a strength measuring mechanism for measuring the flexural strength of the device chip by fracturing the device chip if the controller recognizes the attribute information indicating that the device chip includes a defective device, and a chip observing mechanism for measuring one or more of chipping, reverse side roughness, or side surface roughness of the device chip if the controller recognizes the attribute information indicating that the device chip includes an acceptable device.

According to the above aspect and other aspect of the present invention, by thus measuring the flexural strength of the device chip including a "defective device," the measured flexural strength can be added as attribute information of device chips including "acceptable devices." Accordingly, attribute information of flexural strength can be obtained for device chips distinguished as including "acceptable devices" that cannot be fractured as they are handled as products. The flexural strength is obtained as a measured result from the defective device on the same wafer and hence highly reliable, and can be used as a substitute for the flexural strength of device chips distinguished as including "acceptable devices." Information regarding chipping, reverse side roughness, and side surface roughness can also be acquired with respect to device chips distinguished as including "acceptable devices."

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
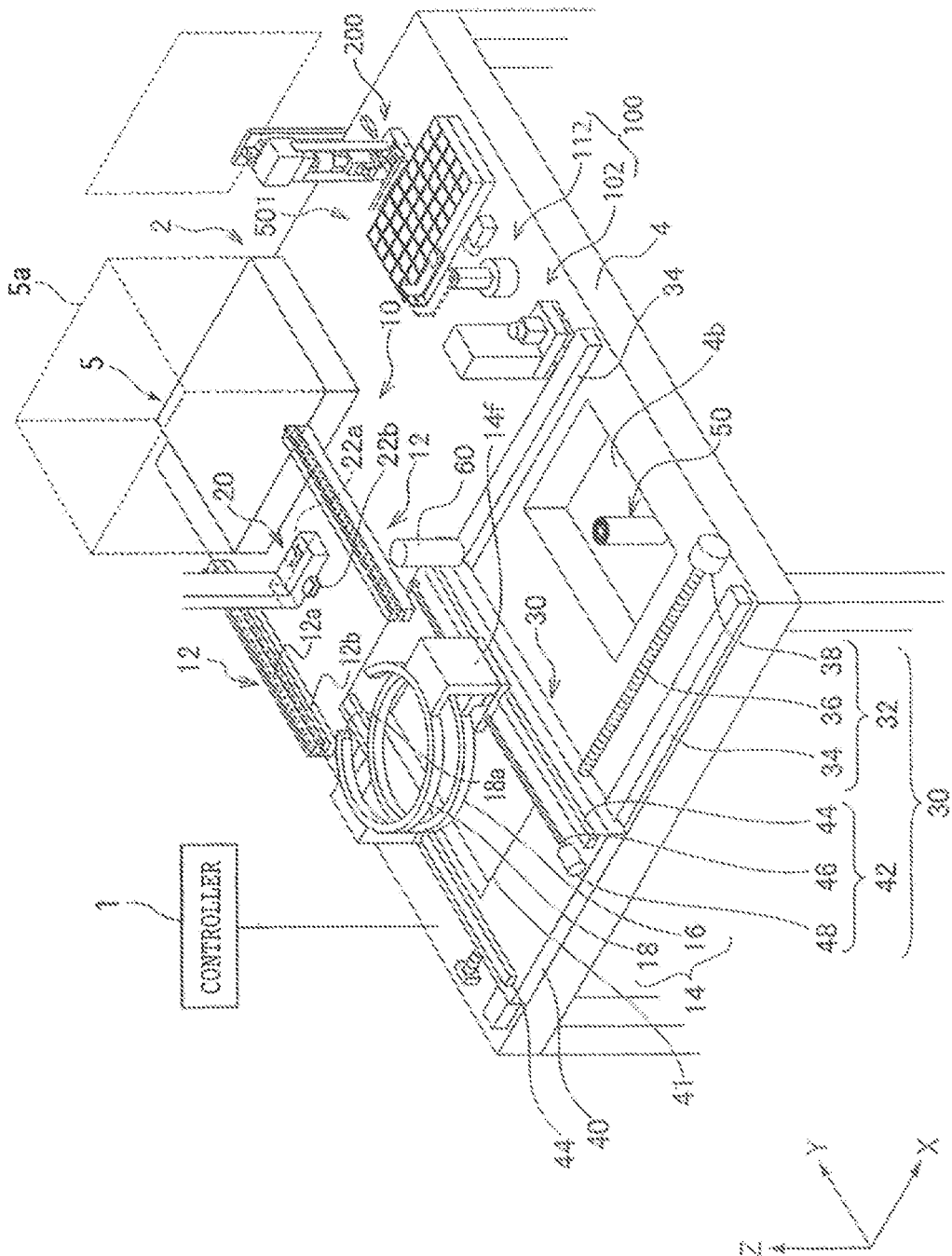
FIG. 1 is a perspective view, partly omitted from illustration, illustrating a configuration of a pick-up apparatus.
Figure 2:
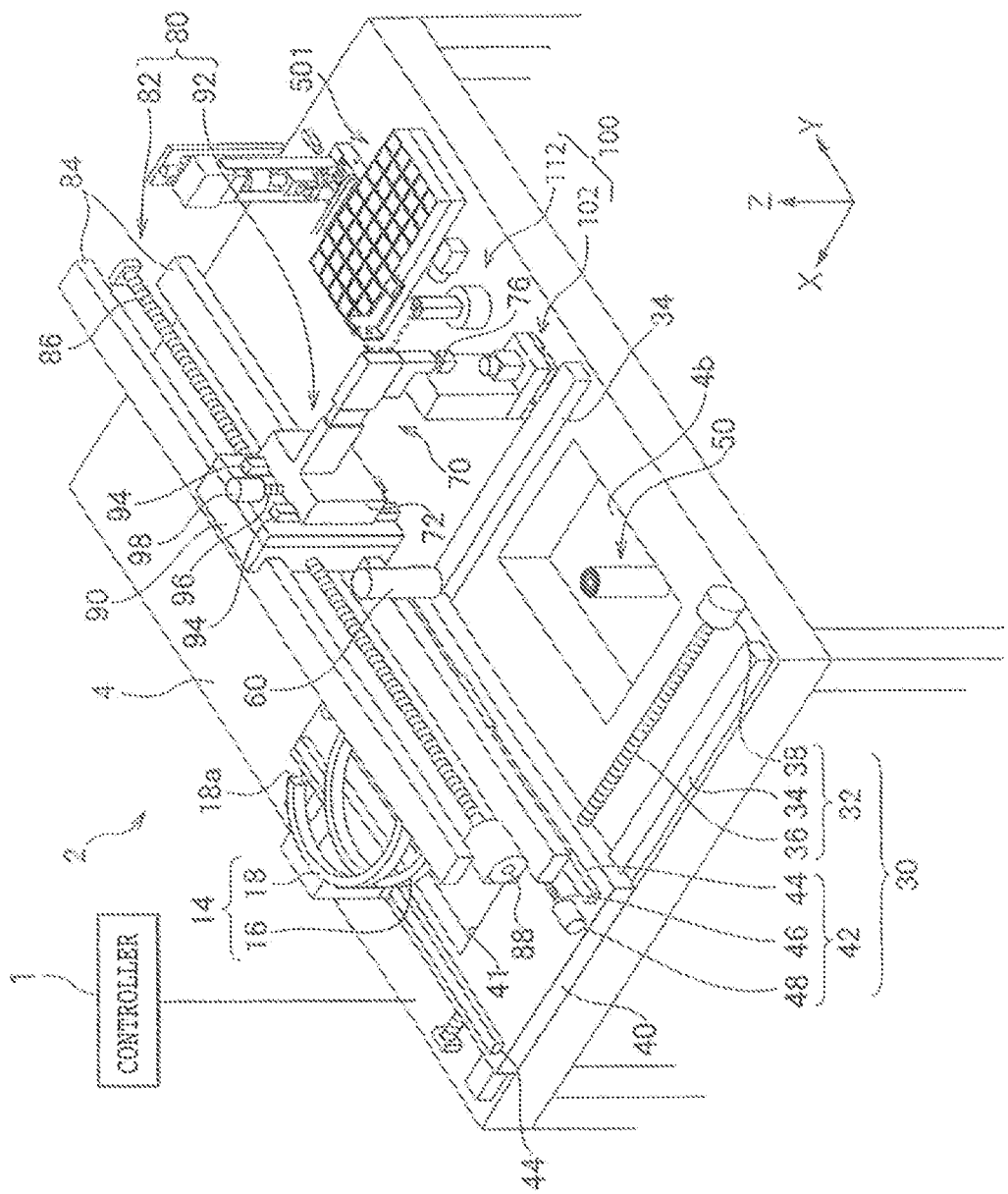
FIG. 2 is a perspective view, partly omitted from illustration, illustrating the configuration of the pick-up apparatus.

A preferred embodiment of the present invention will hereinafter be described below with reference to the drawings. FIGS. 1 and 2 illustrate the configuration of a pick-up apparatus 2. In FIG. 1, a pick-up mechanism 70 and a collet moving mechanism 80, to be described later, are omitted from illustration. In FIG. 2, a cassette rest base 5, a cassette 5a, a temporary rest mechanism 10, and a delivery mechanism 20, to be described later, are omitted from illustration. It should be noted that these components are omitted from FIGS. 1 and 2 for illustrative purposes only for a better understanding of the pick-up apparatus 2.

As illustrated in FIGS. 1 and 2, the pick-up apparatus 2 includes a base table 4 supporting thereon various components of the pick-up apparatus 2. The pick-up apparatus 2 includes a cassette rest base 5 mounted on a corner of the base table 4. A cassette 5a is placed on the cassette rest base 5. The cassette 5a houses therein a plurality of wafer units 11 (see FIG. 3) each including a wafer 13 separated into individual device chips 23 by a cutting process or the like and held on an annular frame 21 by a tape 19. The device chips 23 are rectangular in shape as viewed in plan.

The pick-up apparatus 2 includes a temporary rest mechanism 10 disposed on the base table 4 adjacent to the cassette rest base 5, for temporarily supporting wafer units 11 in two tiers thereon. The temporary rest mechanism 10 includes a pair of guide rails 12 lying parallel to each other. Each of the guide rails 12 has two shelves including a first support surface 12a and a second support surface 12b, respectively, extending generally parallel to X-axis directions, i.e., first horizontal directions or leftward and rightward directions, and Y-axis directions, i.e., second horizontal directions or forward and rearward directions.

As illustrated in FIG. 1, the first support surfaces 12a are disposed above the second support surfaces 12b in overlapping relation thereto. The paired first support surfaces 12a and the paired second support surfaces 12b can support the respective lower surfaces of ends of wafer units 11, i.e., annular frames 21 thereof (see FIG. 3). For example, the paired first support surfaces 12a support thereon a wafer unit 11 delivered from the cassette 5a on the cassette rest base 5, whereas the paired second support surfaces 12b support thereon another wafer unit 11 delivered from a frame securing mechanism 14 to be described below. As illustrated in FIG. 1, the frame securing mechanism 14 is disposed on the base table 4 adjacent to the temporary rest mechanism 10. The frame securing mechanism 14 includes a frame support 16 for supporting the lower surface of an annular frame 21 (see FIG. 3), and a frame holder 18 disposed above the frame support 16 for contacting the upper surface of the annular frame 21. The frame support 16 and the frame holder 18 are of an annular shape similar to the annular frame 21 and are disposed one over the other.

The frame support 16 illustrated in FIG. 1 is movable along Z-axis directions, i.e., vertical directions or upward and downward directions. When the frame support 16 is moved upwardly while a wafer unit is being placed in the frame securing mechanism 14 with the annular frame 21 thereof being supported by the frame support 16, the annular frame 21 is secured in place by being sandwiched between the frame support 16 and the frame holder 18.

It is confirmed whether the annular frame 21 is properly secured by the frame securing mechanism 14 or not by, for example, detecting whether electrical conduction is provided between the frame support 16 and the frame holder 18 through the annular frame 21 or not.

As illustrated in FIG. 1, a delivery mechanism, i.e., delivery means, 20 for delivering a wafer unit 11 (see FIG. 3) between the cassette rest base 5 and the frame securing mechanism 14 is disposed above the temporary rest mechanism 10 and the frame support 16. The delivery mechanism 20, which is movable along the Y-axis directions and the Z-axis directions, includes a first gripper 22a and a second gripper 22b for vertically gripping the annular frame 21 of the wafer unit 11. The first gripper 22a is disposed on a side of the delivery mechanism 20 that faces the cassette rest base 5, and the second gripper 22b is disposed on a side of the delivery mechanism 20 that faces the frame securing mechanism 14.

As illustrated in FIG. 1, for unloading a wafer unit 11 from the cassette 5a on the cassette rest base 5, the first gripper 22a of the delivery mechanism 20 grips an end of the wafer unit 11 in the cassette 5a, and the delivery mechanism 20 is moved toward the temporary rest mechanism 10 along one of the Y-axis directions. The wafer unit 11 is now pulled out of the cassette 5a and placed on the first support surfaces 12a in the upper tier of the temporary rest mechanism 10. Thereafter, the first gripper 22a releases the wafer unit 11.

Next, the second gripper 22b of the delivery mechanism 20 grips an end of the wafer unit 11 which faces the cassette 5a, and the delivery mechanism 20 is moved toward the frame securing mechanism 14 along the one of the Y-axis directions. The wafer unit 11 is delivered to a position between the frame support 16 and the frame holder 18, with the annular frame 21 supported on the frame support 16.

As illustrated in FIGS. 1 and 2, the frame holder 18 has a portion cut away to define a recess 18a therein closely to the temporary rest mechanism 10. The recess 18a is of a size large enough to allow the delivery mechanism 20 to pass therethrough. Therefore, when the wafer unit 11 is delivered toward the frame securing mechanism 14, the delivery mechanism 20 is prevented from contacting the frame holder 18.

Thereafter, as illustrated in FIG. 1, the second gripper 22b releases the wafer unit 11, and the frame support 16 is moved upwardly. The annular frame 21 is thus secured in place by being sandwiched between the frame support 16 and the frame holder 18.

As illustrated in FIGS. 1 and 2, the frame securing mechanism 14 is supported on a positioning mechanism 30 that controls the position of the frame securing mechanism 14. The positioning mechanism 30 includes an X-axis moving mechanism 32 for moving the frame securing mechanism 14 along the X-axis directions, and a Y-axis moving mechanism 42 for moving the frame securing mechanism 14 along the Y-axis directions. The position of the frame securing mechanism 14 in the horizontal directions is controlled by the X-axis moving mechanism 32 and the Y-axis moving mechanism 42.

The X-axis moving mechanism 32 includes a pair of parallel guide rails 34 disposed on the base table 4 and extending along the X-axis directions, and a ball screw 36 disposed between the guide rails 34 and extending generally parallel thereto. A stepping motor 38 for rotating the ball screw 36 about its own central axis is coupled to an end of the ball screw 36. The positioning mechanism 30 includes a movable block 40 slidably mounted on the guide rails 34. A nut, not depicted, is mounted on a lower surface, i.e., a reverse side, of the movable block 40 and threaded over the ball screw 36. When the ball screw 36 is rotated about its own central axis by the stepping motor 38, the movable block 40 is moved in the X-axis directions along the guide rails 34.

The Y-axis moving mechanism 42 includes a pair of parallel guide rails 44 disposed on the movable block 40 and extending along the Y-axis directions, and a ball screw 46 disposed between the guide rails 44 and extending generally parallel thereto. A stepping motor 48 for rotating the ball screw 46 about its own central axis is coupled to an end of the ball screw 46.

As illustrated in FIG. 1, the frame securing mechanism 14 is slidably mounted on the guide rails 44. The frame securing mechanism 14 includes a support 14f that supports the frame support 16 and the frame holder 18. The support 14f has a nut, not depicted, threaded over the ball screw 46. When the ball screw 46 is rotated about its own central axis by the stepping motor 48, the frame securing mechanism 14 is moved in the Y-axis directions along the guide rails 44.

As illustrated in FIGS. 1 and 2, the movable block 40 is shaped as a plate having a vertically through opening 41 defined therein below the frame securing mechanism 14.

The opening 41 allows an ejector mechanism 50, to be described later, to eject a device chip therethrough.

The base table 4 has a rectangular opening 4b defined in an area thereof between the guide rails 34. The ejector mechanism, i.e., ejecting means, 50 in a hollow cylindrical shape is disposed in the opening 4b for ejecting a device chip 23 (see FIG. 3) upwardly from the wafer 13 of the wafer unit 11 by pushing a lower surface thereof upwardly. The ejector mechanism 50 is connected to a lifting and lowering mechanism, not depicted, including an air cylinder or the like, and is movable vertically along the Z-axis directions.

Figure 4:
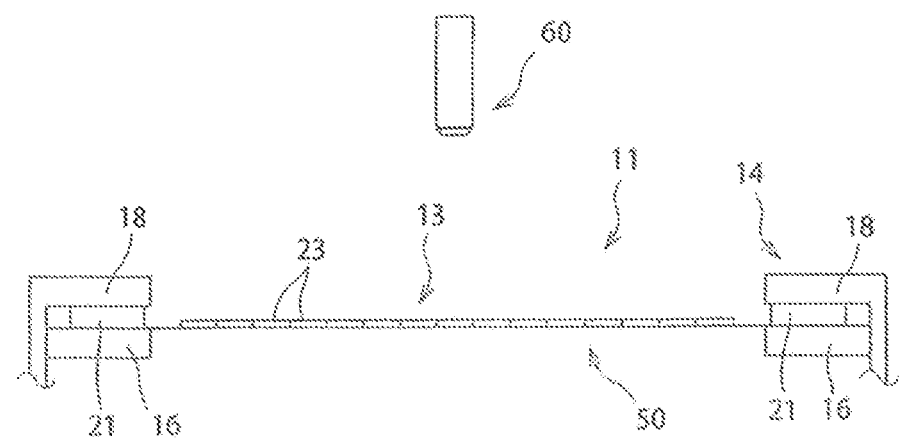
FIG. 4 is a schematic elevational view illustrating the manner in which an image of the wafer is captured by a wafer image capturing camera.

While the annular frame 21 of a wafer unit 11 is being secured in position by the frame securing mechanism 14, the frame securing mechanism 14 is moved in one of the X-axis directions by the positioning mechanism 30 until the wafer unit 11 is positioned above the opening 4b. As illustrated in FIGS. 1, 2, and 4, a wafer image capturing camera, i.e., image capturing means, 60 for capturing an image of the upper surface of the wafer 13 (see FIG. 4) supported by the annular frame 21 secured by the frame securing mechanism 14 is disposed over the path along which the frame securing mechanism 14 is moved to a position above the ejector mechanism 50.

The wafer image capturing camera 60 captures an image of the wafer 13 while the annular frame 21 is being secured by the frame securing mechanism 14. In addition, the wafer image capturing camera 60 may capture an image of the wafer 13 at a timing when the wafer unit 11 is delivered by the delivery mechanism 20 before the annular frame 21 is secured by the frame securing mechanism 14, a timing when the wafer unit 11 is placed on the temporary rest mechanism 10, a timing when the cassette 5a, which houses therein the wafer unit 11, is placed on the cassette rest base 5, or the like. The wafer image capturing camera 60 may be disposed in respective positions suitable for capturing images at these timings.

Figure 5A:
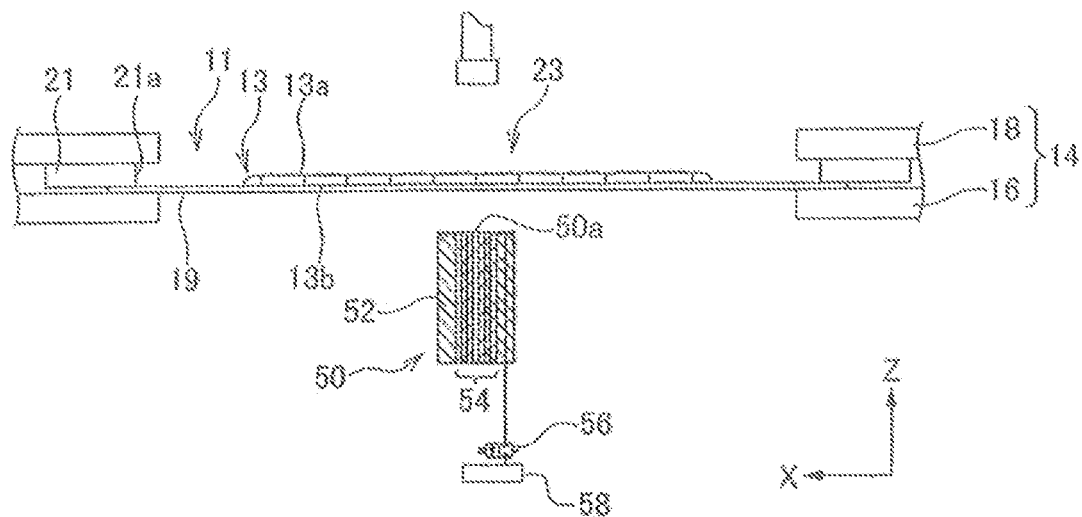
FIG. 5A is a schematic cross-sectional view illustrating the wafer unit disposed above an ejector mechanism.

As illustrated in FIGS. 1 and 2, the frame securing mechanism 14 positioned above the opening 4b is adjusted in position by the positioning mechanism 30 to position a device chip 23 to be picked up directly above the ejector mechanism 50, as illustrated in FIG. 5A.

FIG. 5A schematically illustrates in cross section the wafer unit 11 disposed above the ejector mechanism 50. As illustrated in FIG. 5A, the ejector mechanism 50 includes an outer layer 52 shaped as a hollow cylinder, and an ejector portion 54 shaped as a quadrangular prism disposed in the outer layer 52.

Figure 5B:
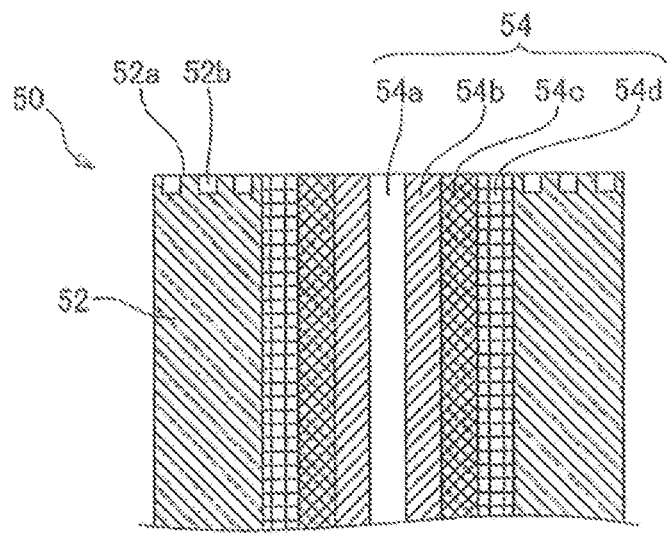
FIG. 5B is an enlarged fragmentary cross-sectional view of the ejector mechanism.

FIG. 5B illustrates the ejector mechanism 50 in enlarged fragmentary cross section. As illustrated in FIG. 5B, the outer layer 52 has a plurality of concentric suction grooves 52b defined in an upper surface thereof and extending along circumferential directions of the outer layer 52. Each of the suction grooves 52b is connected to a suction source 58 such as an ejector or the like through suction passages, not depicted, defined in the ejector mechanism 50 and a valve 56 (see FIG. 5A).

The ejector portion 54 also includes a first ejector pin 54a shaped as a quadrangular prism, a second ejector pin 54b shaped as a hollow quadrangular prism and surrounding the first ejector pin 54a, a third ejector pin 54c shaped as a hollow quadrangular prism and surrounding the second ejector pin 54b, and a fourth ejector pin 54d shaped as a hollow quadrangular prism and surrounding the third ejector pin 54c. The first ejector pin 54a, the second ejector pin 54b, the third ejector pin 54c, and the fourth ejector pin 54d are connected to respective lifting and lowering mechanisms, not depicted, such as electric motors or the like, and can be independently lifted and lowered along the Z-axis directions by the lifting and lowering mechanisms.

When the ejector mechanism 50 is lifted while the wafer unit 11 is being positioned above the ejector mechanism 50, a device chip 23 disposed in a position overlying the ejector mechanism 50 is pushed upwardly, i.e., ejected, by the ejector mechanism 50. The size of the ejector mechanism 50 is appropriately adjusted depending on the size of the device chips 23.

As illustrated in FIG. 2, the device chip 23 ejected by the ejector mechanism 50 is picked up by a pick-up mechanism 70. The pick-up mechanism 70 includes a collet 76 for picking up the device chip 23 ejected by the ejector mechanism 50 and a collet moving mechanism, i.e., collet moving means, 80 for controlling the position of the collet 76.

Figure 6:
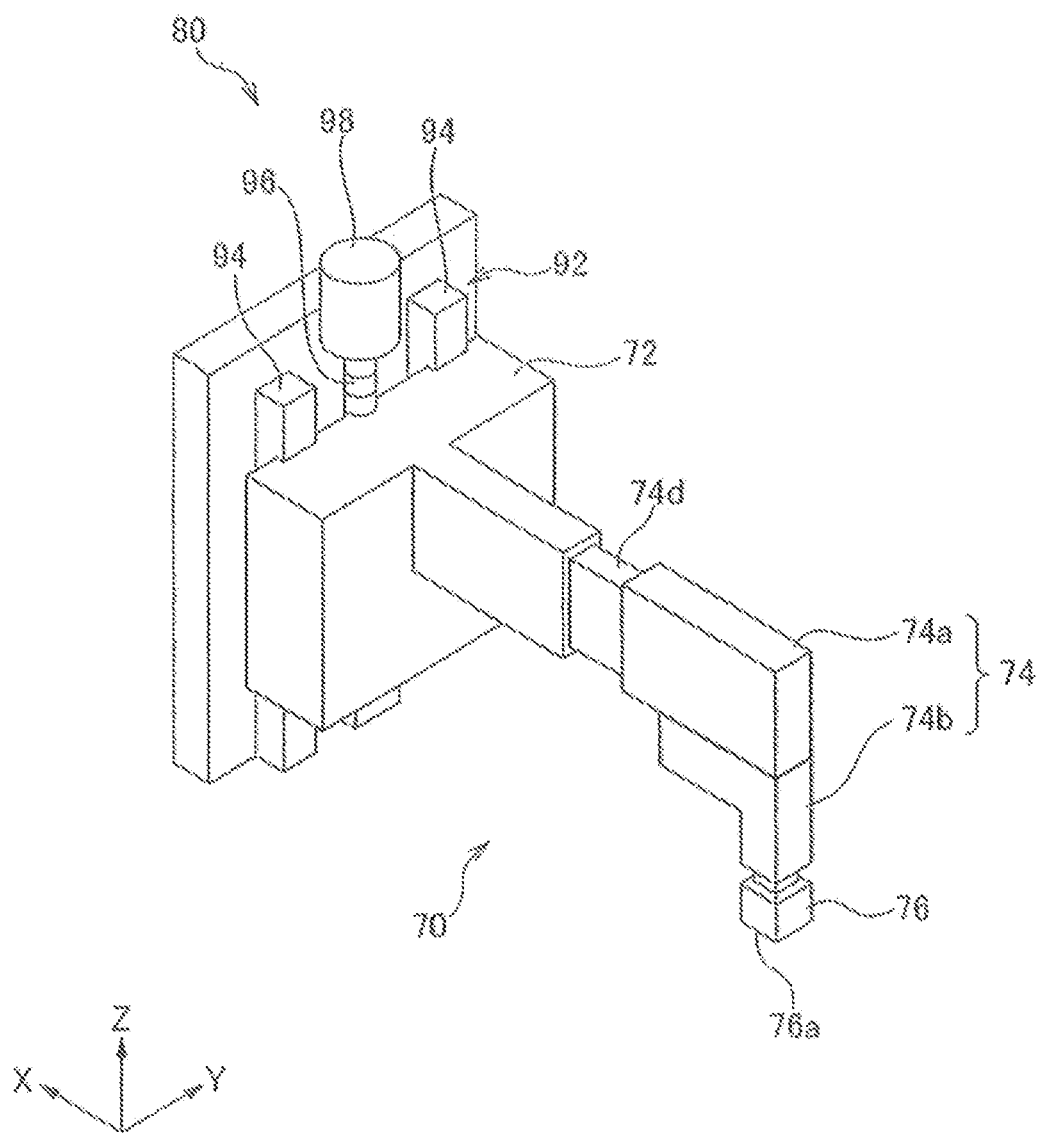
FIG. 6 is a perspective view of a pick-up mechanism.

FIG. 6 illustrates the pick-up mechanism 70 in perspective. As illustrated in FIG. 6, the pick-up mechanism 70 includes a movable base 72 connected to the collet moving mechanism 80, and a columnar arm 74 extending from the movable base 72 in one of the X-axis directions away from the collet moving mechanism 80 and interconnecting the collet moving mechanism 80 and the collet 76. The arm 74 includes a columnar first support 74a connected to the collet moving mechanism 80 through the movable base 72, and a second support 74b protruding downwardly from a distal end of the first support 74a.

The first support 74a and the second support 74b can be coupled to each other and separated from each other. For example, the first support 74a and the second support 74b are attachable to and detachable from each other by a tool changer or the like. The first support 74a is also movable in the X-axis directions by an X-axis moving mechanism 74d, thereby making the second support 74b movable in the X-axis directions. Accordingly, the first support 74a and the second support 74b make it possible to select a storage position in the X-axis directions for storing a device chip 23 in a chip storage tool 501 to be described later.

As illustrated in FIG. 6, the collet 76 for holding a device chip 23 (see FIG. 3) is fixed to the lower end of the second support 74b. The collet 76 has a lower surface provided as a suction surface 76a for holding the device chip 23 under suction. The suction surface 76a is connected to a suction source, not depicted, through a suction channel, not depicted, defined in the collet 76. While the device chip 23 is being held in contact with the suction surface 76a of the collet 76, the suction source is actuated to apply a negative pressure to the suction surface 76a, holding the device chip 23 under suction on the collet 76.

As illustrated in FIG. 2, the pick-up mechanism 70 is operatively connected to the collet moving mechanism 80. The collet moving mechanism 80 includes a Y-axis moving mechanism 82 for moving the pick-up mechanism 70 along the Y-axis directions, and a Z-axis moving mechanism 92 for moving the pick-up mechanism 70 along the Z-axis directions. The Y-axis moving mechanism 82 and the Z-axis moving mechanism 92 control the positions of the collet 76 in the Y-axis directions and the Z-axis directions.

The Y-axis moving mechanism 82 includes a pair of parallel guide rails 84 extending along the Y-axis directions, and a ball screw 86 disposed between and extending generally parallel to the guide rails 84. A stepping motor 88 for rotating the ball screw 86 about its own central axis is coupled to an end of the ball screw 86.

The Y-axis moving mechanism 82 also includes a movable block 90 slidably mounted on the guide rails 84. A nut, not depicted, is mounted on the movable block 90 and threaded over the ball screw 86. When the ball screw 86 is rotated about its own central axis by the stepping motor 88, the movable block 90 is moved in the Y-axis directions along the guide rails 84.

As illustrated in FIGS. 2 and 6, the Z-axis moving mechanism 92 includes a pair of parallel guide rails 94 disposed on the side surface of the movable block 90 along the Z-axis directions, and a ball screw 96 disposed between and extending generally parallel to the guide rails 94. Also, a stepping motor 98 for rotating the ball screw 96 about its own central axis is coupled to an end of the ball screw 96.

As illustrated in FIG. 6, the movable base 72 of the pick-up mechanism 70 is slidably mounted on the guide rails 94. Also, the movable base 72 has a nut, not depicted, threaded over the ball screw 96. When the ball screw 96 is rotated about its own central axis by the stepping motor 98, the movable base 72 is moved in the Z-axis directions along the guide rails 94.

The pick-up mechanism 70 thus constructed picks up a device chip 23 that is ejected by the ejector mechanism 50. An example of operation of the ejector mechanism 50 and the collet 76 for picking up a given device chip 23 from the wafer 13 will be described below.

As illustrated in FIG. 5A, a wafer unit 11 that has been secured by the frame securing mechanism 14 is moved by the positioning mechanism 30 to a position over the ejector mechanism 50. Then, the position of the frame securing mechanism 14 is adjusted to place a given device chip 23 to be picked up from the wafer 13 in a position overlying the ejector mechanism 50 on the basis of an image captured by the wafer image capturing camera 60. At this time, the collet 76 of the pick-up mechanism 70 is disposed in a position opposite, i.e., overlying, an upper surface 50a of the ejector mechanism 50 (see FIG. 7A).

Figure 7A:
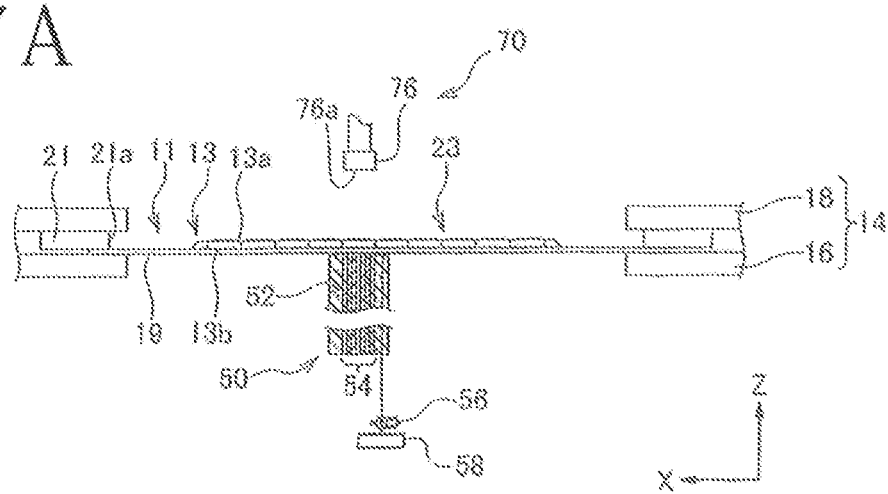
FIG. 7A is a schematic cross-sectional view illustrating the wafer unit whose tape has been attracted under suction by the ejector mechanism.

Next, as illustrated in FIG. 7A, the ejector mechanism 50 is moved upwardly to bring the upper surface 50a thereof into contact with the tape 19 affixed to the reverse side of the device chip 23. Then, the valve 56 is opened to allow the negative pressure from the suction source 58 to act through the suction grooves 52b (see FIG. 5B) on an upper surface 52a of the outer layer 52 of the ejector mechanism 50. The area of the tape 19 that is held in contact with the ejector mechanism 50 is accordingly attracted under suction to the upper surface 52a of the outer layer 52. FIG. 7A illustrates in cross section the wafer unit 11 whose tape 19 has been attracted under suction by the ejector mechanism 50.

Figure 7B:
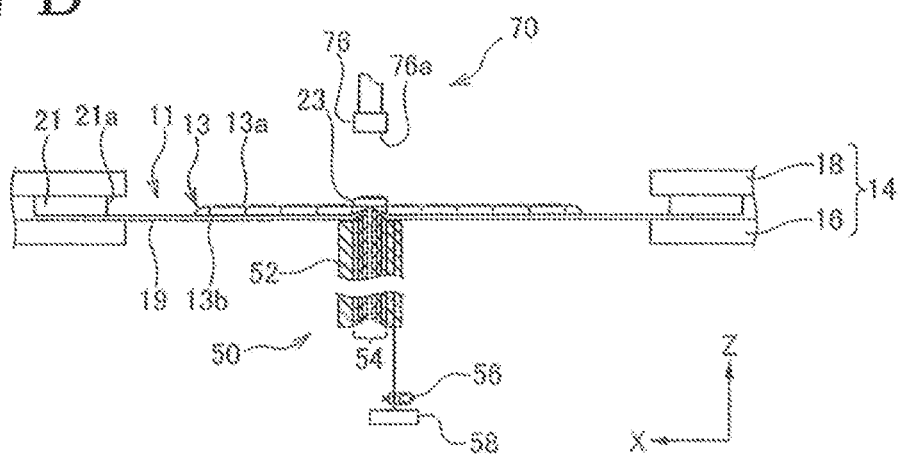
FIG. 7B is a schematic cross-sectional view illustrating the wafer unit from which a device chip has been ejected by the ejector mechanism.

Then, as illustrated in FIG. 7B, the ejector portion 54 of the ejector mechanism 50 is moved upwardly to push the lower surface of the device chip 23 upwardly with the tape 19 interposed therebetween. At this time, the first ejector pin 54a, the second ejector pin 54b, the third ejector pin 54c, and the fourth ejector pin 54d of the ejector portion 54 are moved upwardly by different strokes such that their upper ends are positioned progressively more upwardly as they are closer to the center of the ejector mechanism 50. The device chip 23 pushed upwardly by the ejector mechanism 50 is now raised higher than the other device chips 23 of the wafer 13.

Figure 7C:
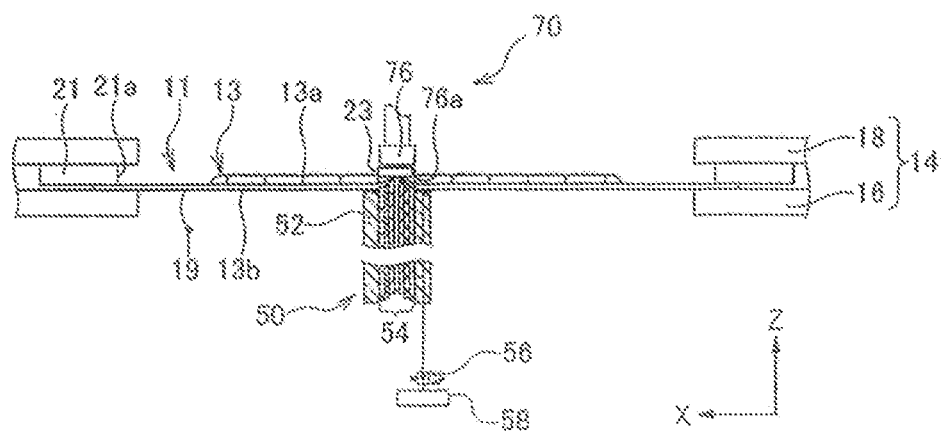
FIG. 7C is a schematic cross-sectional view illustrating the wafer unit from which the device chip has been picked up by a collet.

Next, as illustrated in FIG. 7C, the pick-up mechanism 70 is moved downwardly to bring the suction surface 76a of the collet 76 that overlies the ejected device chip 23 into contact with the upper surface of the ejected device chip 23. With the suction surface 76a of the collet 76 contacting the upper surface of the ejected device chip 23, the vacuum source connected to the suction surface 76a applies a negative pressure to the suction surface 76a, holding the device chip 23 under suction on the collet 76. Then, the pick-up mechanism 70 is moved upwardly to peel off the device chip 23 from the tape 19, whereupon the collet 76 picks up the device chip 23.

In case the tape 19 is of such a property that its adhesive power decreases when irradiated with ultraviolet rays, a light source for emitting ultraviolet rays may be disposed on the side of the upper surface 50a (see FIGS. 5A and 5B) of the ejector mechanism 50. In this case, when the ejector mechanism 50 is brought into contact with the tape 19 as illustrated in FIG. 7A, the light source applies ultraviolet rays to only the area of the tape 19 that is positioned beneath the device chip 23 to be picked up, locally weakening the adhesive power of the tape 19. The device chip 23 can thus be picked up easily from the wafer 13, and the other device chips 23 remain positioned securely in place by the adhesive power of the area of the tape 19 that has not been irradiated with the ultraviolet rays.

Furthermore, a load cell for measuring a load applied to the device chip 23 to be picked up may be disposed on the side of the upper surface 50a of the ejector mechanism 50 or on the side of the suction surface 76a of the collet 76. In this case, the load cell can measure a load that is applied to the device chip 23 when the device chip 23 is picked up. It is possible, based on the load measured by the load cell, to confirm whether the device chip 23 is damaged when picked up or not or to appropriately change conditions for picking up the device chip 23, e.g., the height of the collet 76 for picking up the device chip 23, or the like, for example.

Next, a configuration of an apparatus for inspecting a device chip that has been picked up will be described below. First, a chip observing mechanism 100 illustrated in FIGS. 1 and 2 for observing a device chip will be described below. The chip observing mechanism 100 illustrated in FIGS. 1 and 2 includes a reverse side observing mechanism 102 for observing the reverse side, i.e., the lower surface, of the device chip 23, and a side surface observing mechanism 112 for observing a side surface of the device chip 23. Each of the reverse side observing mechanism 102 and the side surface observing mechanism 112 has an image capturing unit or camera for capturing an image of the device chip 23.

Figure 8A:
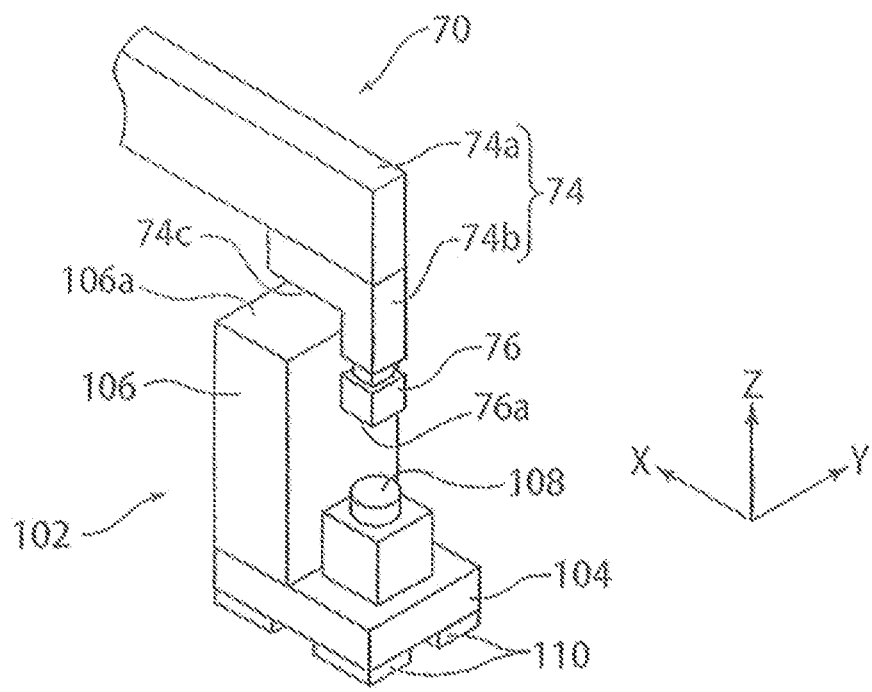
FIG. 8A is a perspective view of a reverse surface observing mechanism.

FIG. 8A illustrates the reverse side observing mechanism 102 in perspective. As illustrated in FIG. 8A, the reverse side observing mechanism 102 includes a support base 104 in the form of a rectangular parallelepiped mounted on the base table 4, and a columnar support structure 106 extending upwardly from the upper surface of an end portion of the support base 104. The reverse side observing mechanism 102 also includes a reverse side image capturing unit, i.e., a reverse side image capturing camera, 108 on the upper surface of another end portion of the support base 104 for capturing an image of the reverse side of the device chip 23.

Vibroisolating members, i.e., vibroisolating means, 110 made of a vibroisolating material such as vibroisolating rubber or the like, for example, are disposed between the base table 4 and the support base 104. The reverse side image capturing unit 108 is disposed on the support base 104 on the vibroisolating members 110. The vibroisolating members 110 are effective to restrain vibrations from being transmitted from the base table 4 to the reverse side image capturing unit 108.

The first support 74a and the second support 74b of the arm 74 can be coupled to each other and separated from each other. The support structure 106 has an upper surface provided as a holder 106a for holding the second support 74b separated from the first support 74a.

Figure 8B:
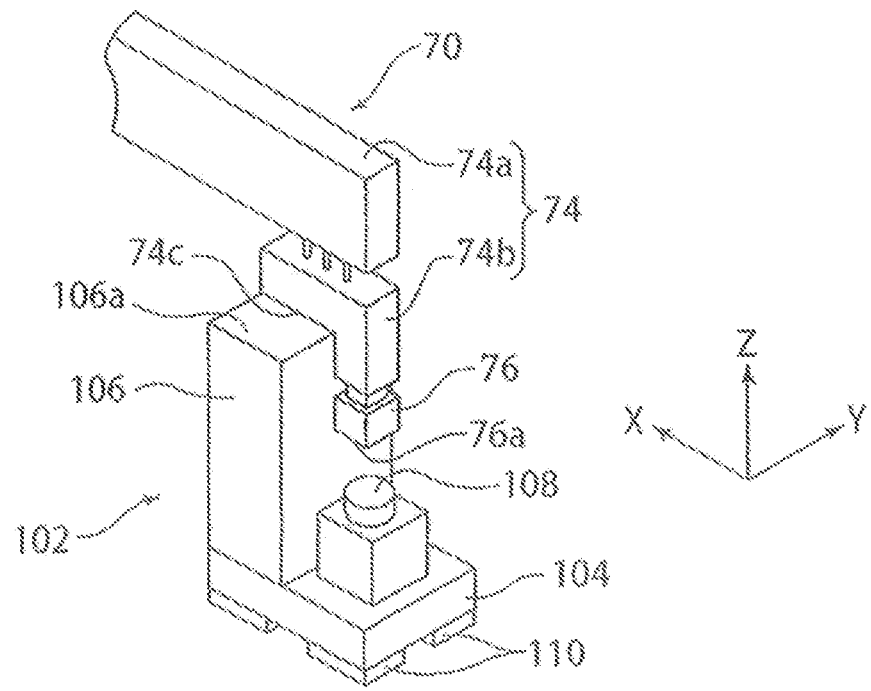
FIG. 8B is a perspective view of the reverse surface observing mechanism that is holding a second support of an arm.

FIG. 8B illustrates in perspective the reverse side observing mechanism 102 that is holding the second support 74b of the arm 74. The second support 74b separated from the first support 74a has a lower surface 74c held on the holder 106a.

The holder 106a is connected to a suction source, not depicted, for example, and holds the second support 74b thereon by attracting the lower surface 74c thereof under suction. However, the holder 106a may hold the second support 74b thereon according to any of various other methods. For example, the holder 106a may include a magnet and the second support 74b may be made of a magnetic material, so that the holder 106a may hold the second support 74b by attracting the lower surface 74c thereof under magnetic forces.

The reverse side image capturing unit 108 captures an image of the reverse side of the device chip 23 held by the collet 76 while the second support 74b separated from the first support 74a is being held on the holder 106a. Vibrations of the first support 74a caused by the collet moving mechanism 80 in operation are thus prevented from being transmitted to the device chip 23, allowing the reverse side image capturing unit 108 to capture an image of the reverse side of the device chip 23 highly accurately.

Figure 9A:
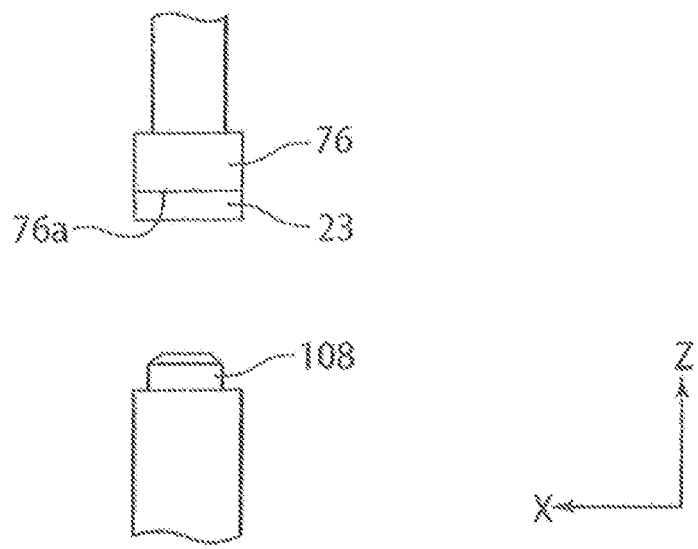
FIG. 9A is a front elevational view of an image capturing unit that is capturing an image of a lower surface of a device chip.

FIG. 9A illustrates in front elevation the reverse side image capturing unit 108 that captures an image of the reverse side of the device chip 23. As illustrated in FIG. 9A, the device chip 23 is positioned in overlying relation to the reverse side image capturing unit 108, and has its reverse side, i.e., its lower surface, observed by the reverse side image capturing unit 108.

The reverse side image capturing unit 108 includes an interferometer having an interference objective lens, or the like, for example, for measuring minute surface irregularities such as processing marks, i.e., saw marks or the like, formed on the reverse side of the device chip 23, in other words, for measuring reverse surface roughness. Additionally, the size of chippings or cracks on side surfaces of the device chip 23 may be measured on the basis of the image captured by the reverse side image capturing unit 108.

Figure 10A:
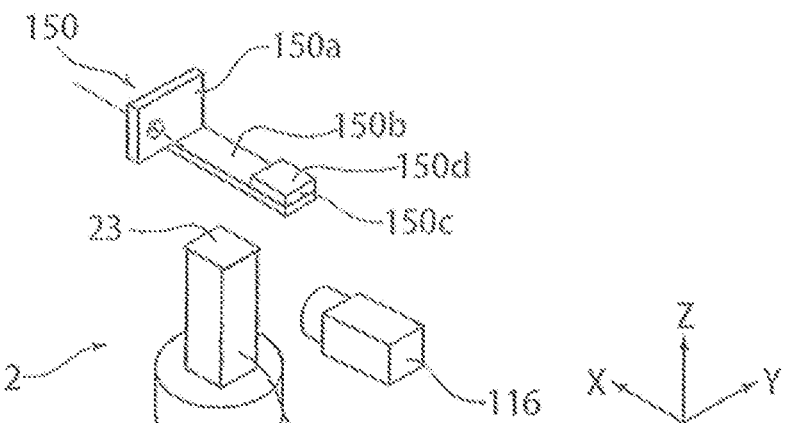
FIG. 10A is a perspective view of a chip inverting mechanism.

As illustrated in FIGS. 1 and 2, the side surface observing mechanism 112 is disposed next to the reverse side observing mechanism 102. As illustrated in FIG. 10A, the side surface observing mechanism 112 includes a columnar chip support rest 114 for supporting a device chip 23 thereon, and a side surface image capturing unit, i.e., a side surface image capturing camera, 116 for capturing an image of a side surface of the device chip 23.

As illustrated in FIG. 10A, the chip support rest 114 has an upper surface lying substantially horizontally and provided as a support surface 114a (see FIG. 10C) for supporting the device chip 23 thereon. The chip support rest 114 is connected to a rotary actuator, not depicted, and is movable about its own central axis generally parallel to the Z-axis directions by the rotary actuator. The side surface image capturing unit 116 is disposed in a position to capture an image of a side surface of the device chip 23 that is placed on the support surface 114a.

Figure 9B:
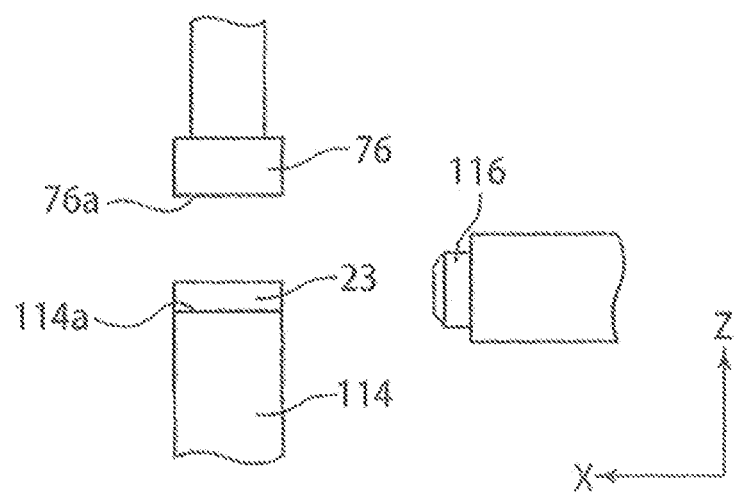
FIG. 9B is a front elevational view of an image capturing unit that is capturing an image of a side surface of the device chip.

FIG. 9B illustrates in front elevation the side surface image capturing unit 116 that captures an image of a side surface of the device chip 23. As illustrated in FIG. 9B, the device chip 23 picked up by the collet 76 is placed on the support surface 114a of the chip support rest 114. Since the chip support rest 114 is disposed in an area overlapping the path along which the collet 76 moves in the pick-up apparatus 2, the collet 76 can place the device chip 23 onto the chip support rest 114.

The side surface image capturing unit 116 captures an image of a side surface of the device chip 23 that is supported on the chip support rest 114. Thereafter, the chip support rest 114 is turned through a predetermined angle, and then side surface image capturing unit 116 captures an image of another side surface of the device chip 23. In this manner, images of side surfaces, i.e., four side surfaces, of the device chip 23 are captured, and the thickness of the device chip 23 and the sizes of chippings or cracks on the side surfaces of the device chip 23, etc. are measured on the basis of the captured images. The side surface image capturing unit 116 may include an interferometer having an interference objective lens, or the like, for measuring minute surface irregularities, i.e., side surface roughness, of the side surfaces of the device chip 23.

The pick-up apparatus 2 may include only one of the reverse side observing mechanism 102 and the side surface observing mechanism 112 or both the reverse side observing mechanism 102 and the side surface observing mechanism 112 depending on the need for observation of the device chip 23 that has been picked up.

A chip inverting mechanism 150 for inverting the orientation of a device chip 23 vertically is disposed above the chip support rest 114 of the side surface observing mechanism 112 illustrated in FIGS. 1 and 2. The chip inverting mechanism 150 is angularly movable 180° about a rotational axis generally parallel to the X-axis directions while holding the device chip 23 on its distal end portion.

FIG. 10A illustrates the chip inverting mechanism 150 in perspective. As illustrated in FIG. 10A, the chip inverting mechanism 150 includes a plate-shaped base bottom 150a lying generally parallel to the Y-axis directions and the Z-axis directions, and a plate-shaped connector 150b oriented from a side surface of the base bottom 150a toward the chip support rest 114 and the side surface image capturing unit 116 along the X-axis directions.

The chip inverting mechanism 150 also includes a rectangular chip holder 150c disposed on a distal end portion of the connector 150b and protruding upwardly from an upper surface of the connector 150b. The chip holder 150c is of a rectangular shape similar to the device chip 23 and has an upper surface provided as a holding surface 150d for holding the device chip 23 under suction thereon.

Figure 10B:
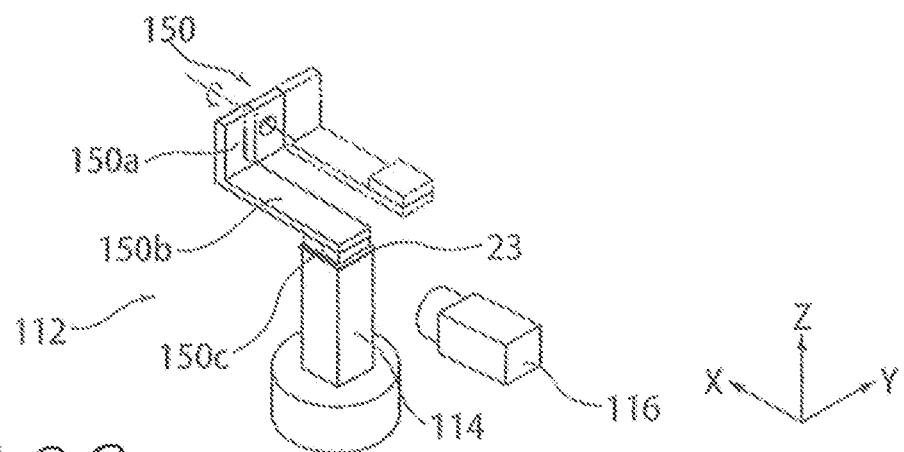
FIG. 10B is a perspective view of the chip inverting mechanism that is holding a device chip.

The base bottom 150a is angularly movable 180° about the rotational axis generally parallel to the X-axis directions. When the base bottom 150a is turned 180° until the chip holder 150c is disposed beneath the connector 150b as illustrated in FIG. 10B, the chip holder 150c faces or overlaps the support surface 114a of the chip support rest 114.

For inverting the orientation of the device chip 23 vertically, the base bottom 150a is turned 180° in a first direction about the rotational axis, i.e., counterclockwise as viewed from the side surface image capturing unit 116, inverting the chip inverting mechanism 150 vertically. The chip holder 150c accordingly faces the device chip 23 supported on the chip support rest 114 and comes into contact with the upper surface of the device chip 23. Then, a negative pressure is applied to the holding surface 150d of the chip holder 150c to cause the chip holder 150c to hold the device chip 23 under suction on the holding surface 150d. FIG. 10B illustrates in perspective the chip inverting mechanism 150 that is holding the device chip 23 under suction.

Figure 10C:
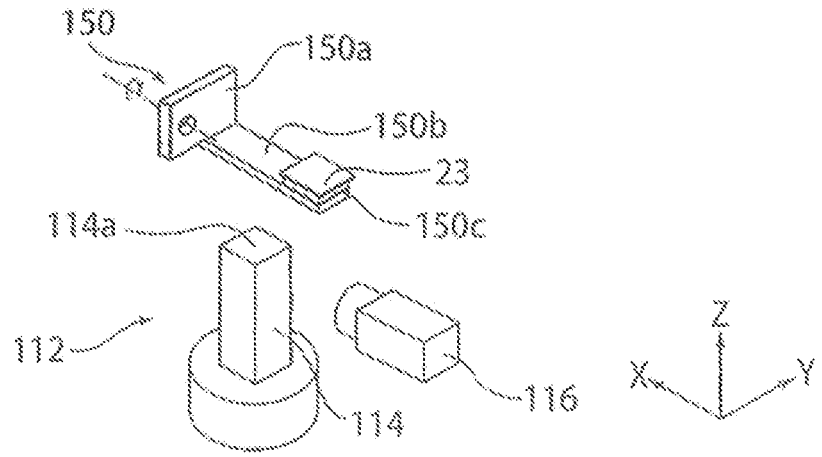
FIG. 10C is a perspective view of the chip inverting mechanism that has inverted the device chip.

Next, while the chip holder 150c is holding the device chip 23 under suction, the base bottom 150a is turned 180° in a second direction about the rotational axis, i.e., clockwise as viewed from the side surface image capturing unit 116, inverting the chip inverting mechanism 150 vertically. The reverse side, i.e., the lower surface, of the device chip 23, which corresponds to the reverse side 13b of the wafer 13, is accordingly exposed upwardly, with the result that the device chip 23 has been inverted vertically. FIG. 10C illustrates in perspective the chip inverting mechanism 150 that has inverted the device chip 23.

The upwardly exposed reverse side of the device chip 23 is then held by the collet 76. The device chip 23 with its reverse side facing upwardly can accordingly be delivered to a strength measuring mechanism 200 (see FIG. 1) by the collet 76. In this manner, the vertical orientation of the device chip 23 to be delivered to the strength measuring mechanism 200 can be changed by the chip inverting mechanism 150.

Figure 11A:
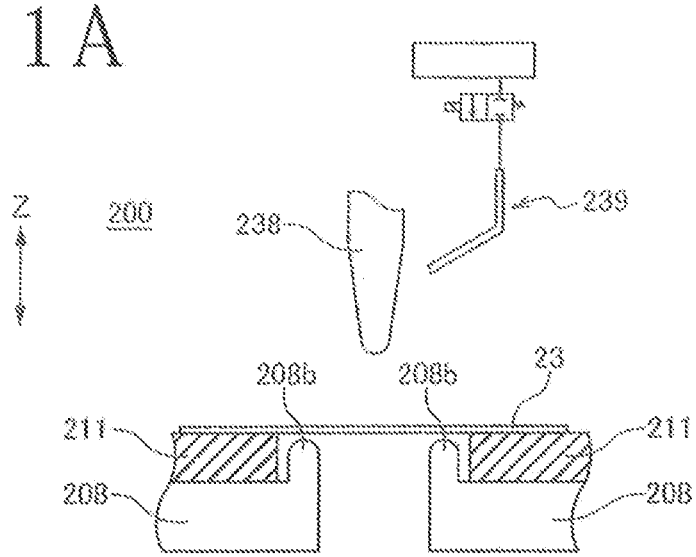
FIG. 11A is a schematic view illustrating the manner in which a device chip is set on a strength measuring mechanism.

As illustrated in FIG. 2, the device chip 23 to be measured for a flexural strength, i.e., a bending strength, is delivered to the strength measuring mechanism 200 by the collet 76, i.e., the collet moving mechanism 80. As illustrated in FIG. 11A, the strength measuring mechanism 200 conducts a three-point bending test on the device chip 23 by pressing the tip end of an indenter 238 against the device chip 23 supported on a pair of supports 208 spaced from each other, as illustrated in FIGS. 11B and 11C.

As illustrated in FIG. 11A, contact members 211 made of a soft material for contacting the lower surface of the device chip 23 are disposed on respective upper surfaces of the supports 208. The contact members 211 hold the lower surface of the device chip 23, creating gaps between the device chip 23 and the supports 208b to prevent the supports 208b from damaging the device chip 23.

Figure 11B:
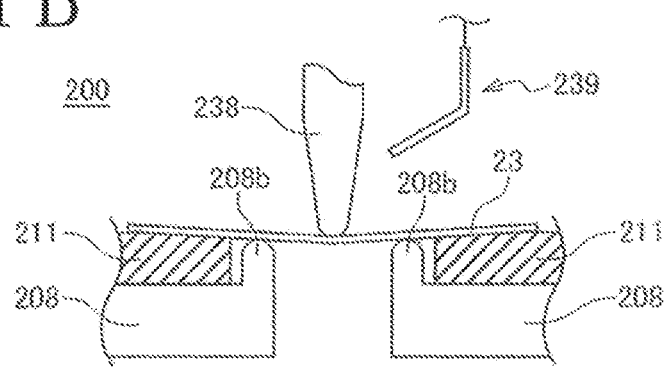
FIG. 11B is a schematic view illustrating the manner in which an indenter is pressing the device chip.
Figure 11C:
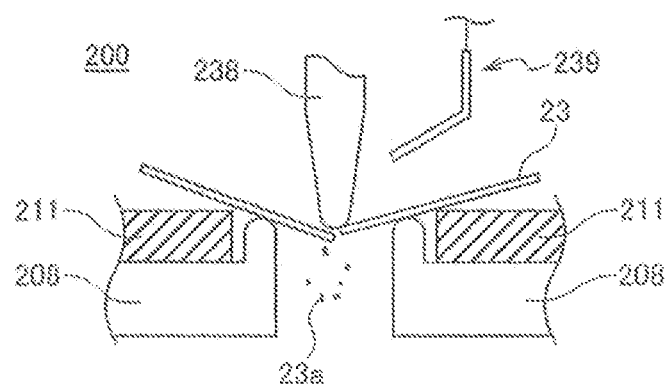
FIG. 11C is a schematic view illustrating the manner in which the device chip is fractured.

As illustrated in FIGS. 11B and 11C, the indenter 238 is gradually lowered to cause the device chip 23 to bring its lower surface into abutment against the supports 208b on both sides, and then to press the upper surface of the device chip 23 by the indenter 238 while at the same time the device chip 23 is being supported from below by the supports 208b, thereby performing a three-point bending test on the device chip 23. The load, i.e., the force in one of the Z-axis directions, applied to the indenter 238 as it presses the device chip 23 is measured by a load measuring instrument, not depicted, and the flexural strength, i.e., the bending strength, of the device chip 23 is calculated on the basis of the measured load.

As illustrated in FIG. 11C, when the device chip 23 is fractured, the device chip 23 produces fragments 23a that tend to be scattered onto the surface of the indenter 238. If the fragments 23a remained on the indenter 238, they would adversely affect the accuracy of the test. Therefore, an air nozzle 239 for ejecting air to a side surface of the indenter 238 to brow away the fragments 23a is disposed in the vicinity of the indenter 238. Before the test starts, it is preferable to apply air from the air nozzle 239 to the indenter 238 to perform an air blowing process.

Figure 12:
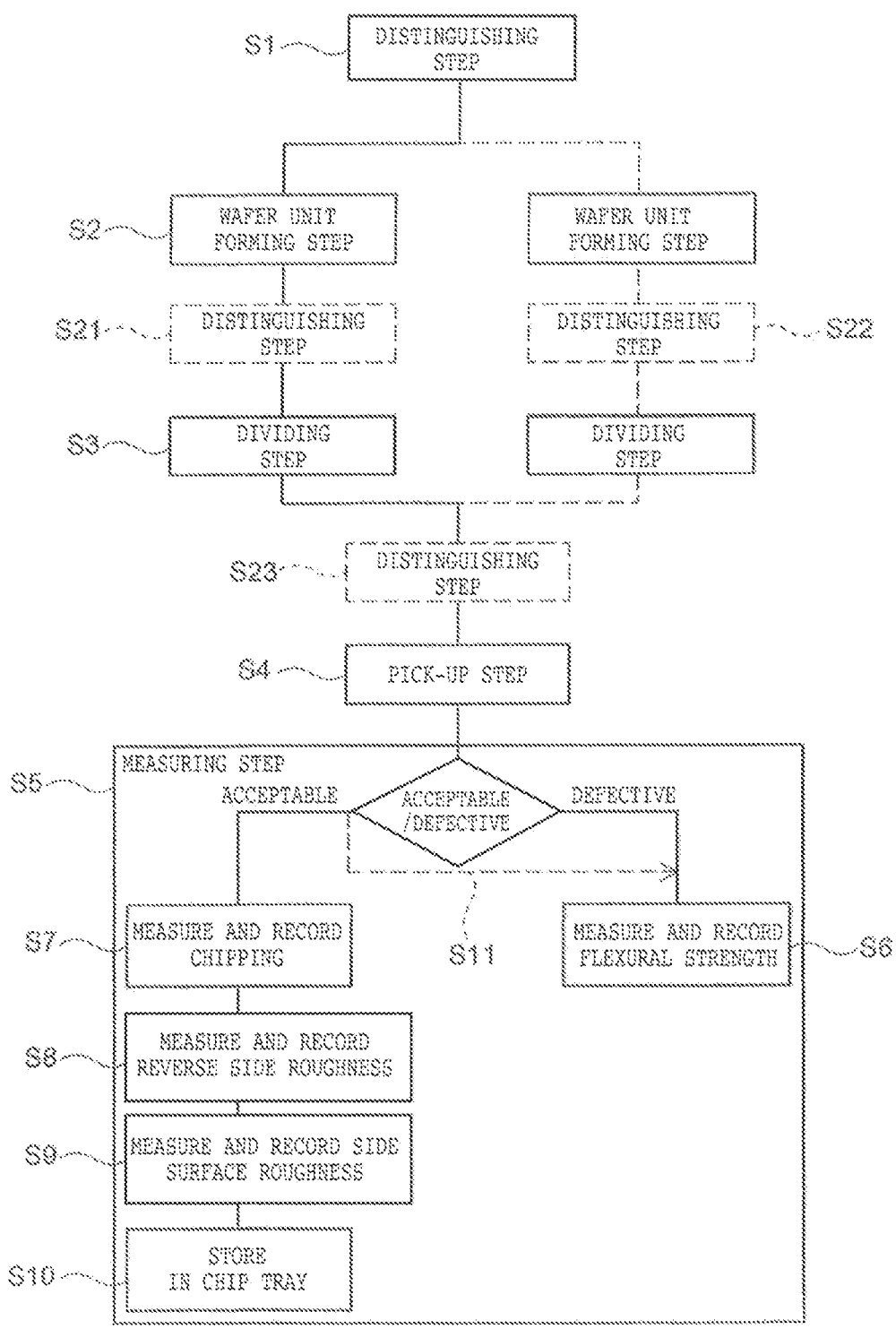
FIG. 12 is a flowchart of a sequence of a method of processing a wafer.

Next, a method of processing a wafer using the apparatus configuration referred to above will be described below. FIG. 12 is a flowchart of a sequence of the method of processing a wafer, which should be referred to when necessary.

<Distinguishing Step>

Figure 13:
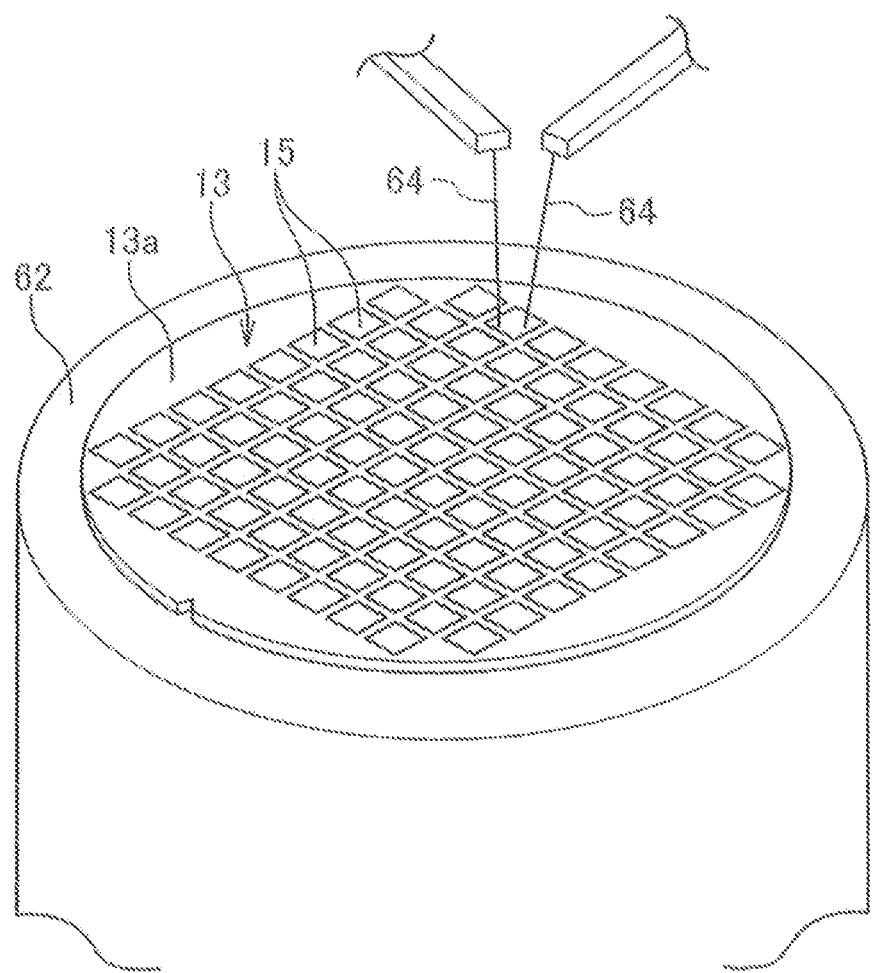
FIG. 13 is a perspective view illustrating the manner in which electrical properties are tested by probers.

First, distinguishing step S1 for inspecting the properties of devices arrayed on a wafer and distinguishing "acceptable devices" and "defective devices" will be described below. As illustrated in FIG. 13, a wafer 13 to be tested is placed on an inspection table 62 of a wafer prober, and probes 64 are brought into contact with devices 15 formed on a face side 13a of the wafer 13 to test the electrical properties of the devices 15. A controller, not depicted, of the wafer prober distinguishes "acceptable devices" and "defective devices" among the devices 15.

The controller of the wafer prober records attribute information of the devices 15, such as positional information and electrical properties thereof, in association with the IDs of the devices 15, so that the recorded attribute information will subsequently be used. Those devices that are of acceptable electrical properties are given attribute information representing "acceptable devices," and those devices that are of defective electrical properties are given attribute information representing "defective devices," after which the attribute information is recorded. The information acquired and recorded by the controller of the wafer prober is transmitted to a controller 1 (see FIGS. 1 and 2) of the pick-up apparatus 2 by way of communication, for example. The pick-up apparatus 2 is thus able to refer to the attribute information of the device chips 23.

As illustrated in FIG. 12, distinguishing step S1 is not limited to any particular timing insofar as it is carried out before pick-up step S4, and may be carried out in either one of steps S21, S22, or S23.

<Wafer Unit Forming Step>

Figure 14:
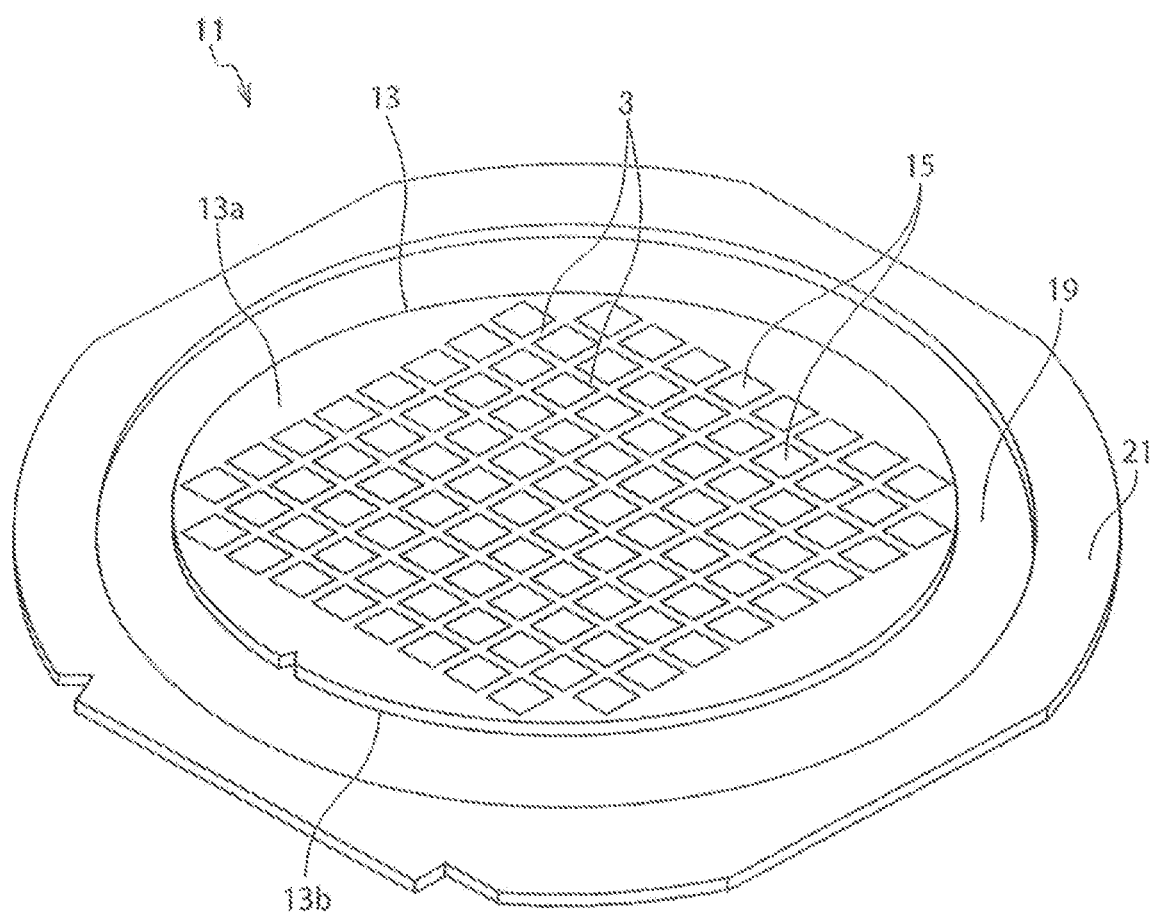
FIG. 14 is a perspective view of a wafer unit that includes a wafer affixed to a tape before the wafer is divided.

Next, wafer unit forming step S2 will be described below. FIG. 14 illustrates in perspective a wafer unit 11 that includes a wafer 13 having a reverse side 13b affixed to a tape 19 and an annular frame 21 holding the wafer 13 through the tape 19. FIG. 14 illustrates wafer unit forming step S2 in which, before the wafer 13 is divided in dividing step S3, the wafer 13 is affixed to the tape 19 and then the tape 19 is attached to the annular frame 21. It is assumed that blade dicing or laser dicing is performed on the wafer 13 in subsequent dividing step S3.

Wafer unit forming step S2 can be carried out after the wafer 13 is divided in dividing step S3. Specifically, in case a Dicing-Before-Grinding (DBG) process in which partly cut grooves are formed in the face side of a workpiece along projected dicing lines by a blade and then the workpiece is divided by grinding the reverse side thereof, or a Stealth-Dicing-Before-Grinding (SDBG) process in which after a Stealth Dicing (SD, registered trademark) process is performed, the workpiece is divided by grinding the reverse side thereof is adopted, the wafer 13 is processed beforehand for division and then affixed to the tape 19.

<Dividing Step>

Figure 3:
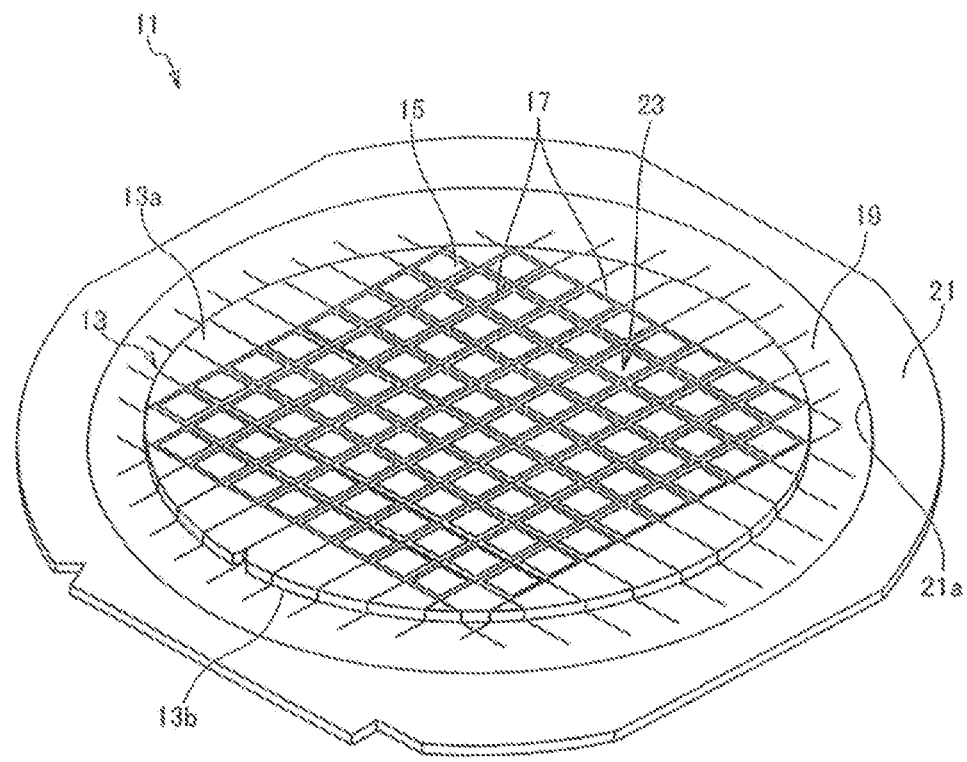
FIG. 3 is a perspective view of a wafer unit including a wafer that has been cut.
Figure 15:
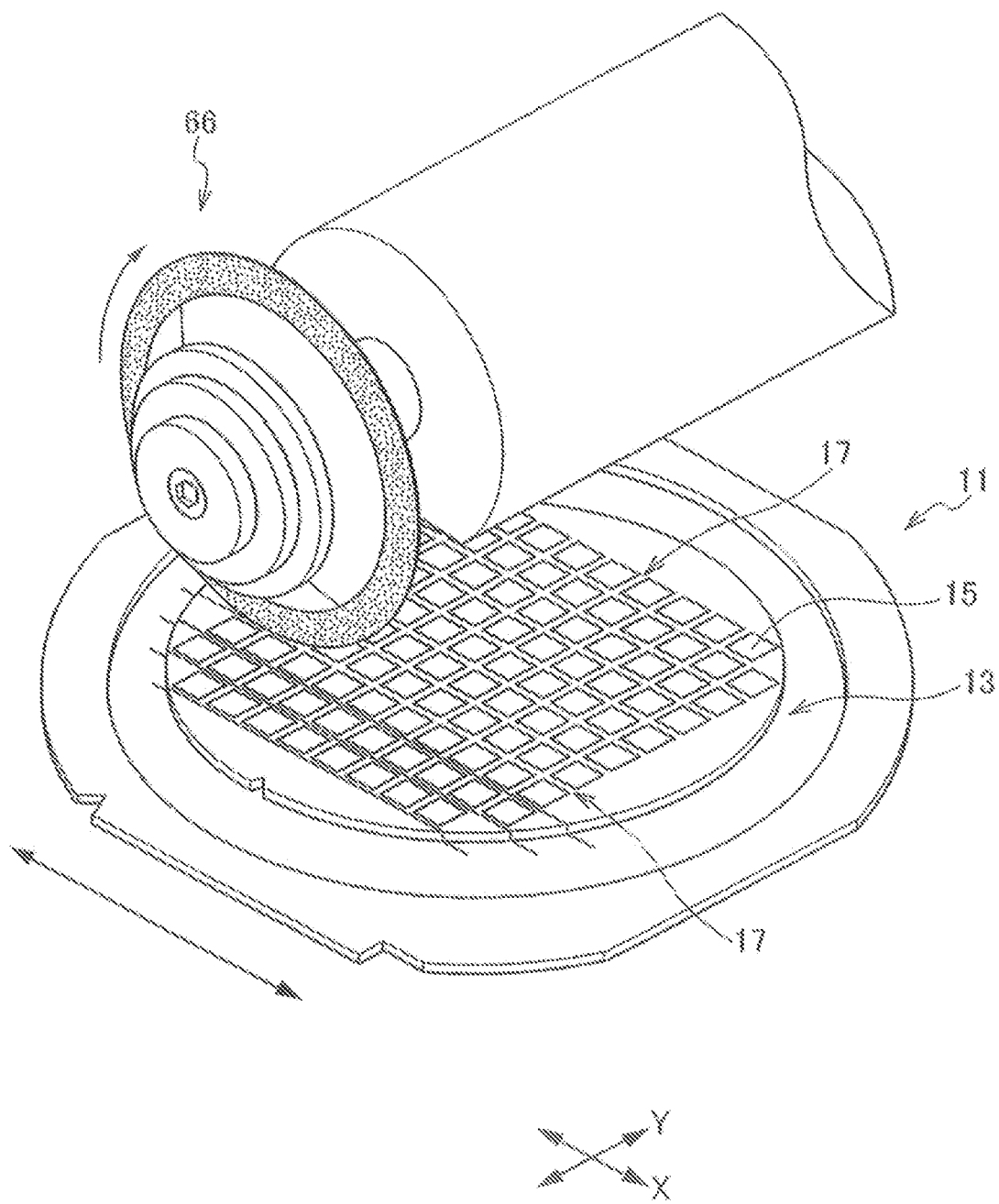
FIG. 15 is a perspective view illustrating a dividing step by way of example.

Next, dividing step S3 will be described below. FIG. 15 illustrates in perspective the manner in which the wafer 13 is cut along projected dicing lines 17 by a cutting blade 66. The wafer 13 is divided into a plurality of device chips 23 including respective devices 15, as illustrated in FIG. 3, by being thus cut. Dividing step S3 is a step of dividing the wafer 13 into the device chips 23, and can adopt the laser dicing, the SD process, the DBG process, or the SDBG process, as described above.

<Pick-Up Step>

Next, pick-up step S4 will be described below. Pick-up step S4 is carried out according to the sequence illustrated in FIGS. 7A through 7C described above. A device chip 23 picked up by the collet 76 is measured in next measuring step S5. The controller 1 of the pick-up apparatus 2 has a distinguished result storage unit for storing the attribute information of the devices 15 that has been acquired by the controller of the wafer prober, i.e., the positional information and the distinguished results representing "acceptable devices" and "defective devices." The controller 1 of the pick-up apparatus 2 refers to the positional information and the distinguished results and carries out a measuring step described below.

<Measuring Step>

Next, measuring step S5 will be described below. Measuring step S5 is carried out using at least one of the reverse side observing mechanism 102, the side surface observing mechanism 112, or the strength measuring mechanism 200 illustrated in FIG. 1. Inspection items to be measured in measuring step S5 include chipping, reverse side roughness, side surface roughness, and flexural strength.

If the device chip 23 that has been picked up has the distinguished result "defective device," then the controller 1 of the pick-up apparatus 2 decides that the flexural strength of the device chip 23 is to be measured, and the device chip 23 is delivered to the strength measuring mechanism 200 in flexural strength measuring and recording step S6. Since the device chip 23 whose flexural strength is to be measured is considered to have the same mechanical properties including the flexural strength as "acceptable devices" although the device chip 23 is a "defective device" with defective electrical properties, the flexural strength of this "defective device" can be referred to as the flexural strength of an "acceptable device." In other words, although device chips need to be fractured in order to measure each flexural strength, flexural strength data can be acquired without fracturing "acceptable devices" by using the "defective device" to measure the flexural strength. The flexural strength data thus acquired is added to the attribute information of other "acceptable devices" by the controller 1.

If the device chip 23 that has been picked up has the distinguished result "acceptable device," then the controller 1 of the pick-up apparatus 2 decides that the device chip 23 is to be measured for chipping, reverse side roughness, and side surface roughness in steps S7, S8, and S9, and the device chip 23 is sequentially delivered to the reverse side observing mechanism 102 and the side surface observing mechanism 112.

<Storing Step>

The device chip 23 having the distinguished result "acceptable device" after it has gone through the various measurement processes as described above is stored in the chip storage tool 501 in step S10. The controller 1 of the pick-up apparatus 2 stores the IDs of the stored device chips 23 in association with the attribute information thereof. The stored data may be appropriately output for use as data for traceability.

The controller 1 of the pick-up apparatus 2 may decide that device chips 23 having the distinguished result "acceptable device" are to be measured for flexural strength in step S11.

The present invention can be realized in the manner described above. Furthermore, the present invention may be reduced to practice as a method of processing a wafer and a chip measuring apparatus to be described below. The method of processing a wafer 13 having devices 15 formed respectively in areas on a face side thereof that are demarcated by a plurality of crossing projected dicing lines 17 on the face side, as illustrated in FIGS. 1, 2, 13, and 14, includes a wafer unit forming step of forming a wafer unit 11 having a wafer 13, a tape 19, and an annular frame 21, the tape 19 being affixed to a reverse side of the wafer 13 and having an outer circumferential portion affixed to the annular frame 21, a dividing step, before or after the wafer unit forming step, of dividing the wafer 13 along the projected dicing lines 17 into a plurality of device chips 23, thereafter, a pick-up step of picking up one at a time of the device chips 23 from the wafer unit 11, a measuring step of measuring the device chip 23 picked up in the pick-up step, and a distinguishing step, before at least the pick-up step, of inspecting properties of the devices to distinguish acceptable devices and defective devices among the devices 15 and storing distinguished results, in which the measuring step includes the step of measuring the flexural strength of the device chip 23 picked up in the pick-up step by fracturing the device chip 23 if the device chip 23 includes a defective device on the basis of the distinguished result, and the step of measuring at least one of chipping, reverse side roughness, or side surface roughness of the device chip 23 picked up in the pick-up step if the device chip 23 includes an acceptable device. By thus measuring the flexural strength of the device chip including a "defective device," the measured flexural strength can be added as attribute information of device chips including "defective devices." Accordingly, attribute information of flexural strength can be obtained for device chips distinguished as including "acceptable devices" that cannot be fractured as they are handled as products. The flexural strength is obtained as a measured result from the "defective device" on the same wafer and hence highly reliable, and can be used as a substitute for the flexural strength of device chips distinguished as including "acceptable devices." Information regarding chipping, reverse side roughness, and side surface roughness can also be acquired with respect to device chips distinguished as including "acceptable devices."

In addition, as illustrated in FIGS. 1 and 2, the method of processing a wafer may further include a storing step, after the measuring step, of storing the device chip 23 picked up in the pick-up step into a chip storage tool 501 if the device chip 23 includes an acceptable device. According to the storing step, device chips 23 can be stored in the chip storage tool 501, and unloaded and shipped all together.

As illustrated in FIGS. 1 and 2, the chip measuring apparatus includes a controller 1 for referring to attribute information representing whether a device chip 23 to be inspected is an acceptable device or a defective device, a strength measuring mechanism for measuring the flexural strength of the device chip 23 by fracturing the device chip 23 if the controller 1 recognizes the attribute information indicating that the device chip 23 includes a defective device, and a chip observing mechanism for measuring at least one of chipping, reverse side roughness, or side surface roughness of the device chip 23 if the controller 1 recognizes the attribute information indicating that the device chip 23 includes an acceptable device. Accordingly, attribute information of flexural strength can be obtained for device chips distinguished as including "acceptable devices" that cannot be fractured as they are handled as products.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A chip measuring apparatus comprising:
   a controller for referring to attribute information representing whether a device chip to be inspected is an acceptable device or a defective device;
   a strength measuring mechanism for measuring the flexural strength of the device chip by fracturing the device chip if the controller recognizes the attribute information indicating that the device chip includes a defective device; and
   a chip observing mechanism for measuring one or more of chipping, reverse side roughness, or side surface roughness of the device chip if the controller recognizes the attribute information indicating that the device chip includes an acceptable device.

* * * * *